US009360662B2

(12) United States Patent
Koptyaev et al.

(10) Patent No.: US 9,360,662 B2
(45) Date of Patent: Jun. 7, 2016

(54) OPTICAL MEASUREMENT SYSTEM AND METHOD FOR MEASURING CRITICAL DIMENSION OF NANOSTRUCTURE

(71) Applicant: Samsung Electronics Co., Ltd., Suwon-si (KR)

(72) Inventors: Sergey Nikolaevich Koptyaev, N.Tagil Sverdlovskoy oblasti (RU); Maxim Vladimirovich Ryabko, Dolgoprudniy (RU); Michael Nikolaevich Rychagov, Moscow (RU)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 532 days.

(21) Appl. No.: 13/656,180

(22) Filed: Oct. 19, 2012

(65) Prior Publication Data
US 2013/0107030 A1    May 2, 2013

(30) Foreign Application Priority Data

Oct. 20, 2011   (RU) .................................. 2011142372
Aug. 3, 2012   (KR) ......................... 10-2012-0085388

(51) Int. Cl.
*G02B 21/36*   (2006.01)
*G03F 7/20*   (2006.01)
(Continued)

(52) U.S. Cl.
CPC .......... *G02B 21/365* (2013.01); *G03F 7/70625* (2013.01); *B82Y 35/00* (2013.01); *H04N 7/18* (2013.01); *Y10S 977/881* (2013.01)

(58) Field of Classification Search
CPC ............................... G02B 21/365; G02B 21/34

USPC ..................... 348/79; 977/773–962; 356/301, 356/445–624
See application file for complete search history.

(56) References Cited

U.S. PATENT DOCUMENTS 6,680,781 B2   1/2004   Kosuge et al.
6,774,991 B1   8/2004   Danko
(Continued)

FOREIGN PATENT DOCUMENTS

KR   10-2008-0051554 A   6/2008
WO   2007/095090 A2   8/2007

OTHER PUBLICATIONS

Logofatu, et al., "The Characterization of Gratings Using the Optical Scatterometer", Rom. Journ. Phys., vol. 55, Nos. 3-4, pp. 376-385, Bucharest, 2010.

(Continued)

Primary Examiner — Jamie Atala
Assistant Examiner — Kathleen Nguyen
(74) Attorney, Agent, or Firm — Sughrue Mion, PLLC

(57) ABSTRACT

An optical measurement system for measuring a critical dimension having a nanostructured surface including a nanostructure formed on a plane. The optical measurement system includes an image recording module including a microscope optical system which records a defocused image having an nonuniform degree of defocusing with respect to the nanostructured surface, an optical scheme parameter control module which sets and outputs to the microscope optical system optical scheme parameters for the microscope optical system, an image calculation module which receives receiving the optical scheme parameters set by the optical scheme parameter control module and calculates an image of the nanostructured surface, and a comparison module which compares the defocused image recorded by the image recording module and the image calculated by the image calculation module.

21 Claims, 5 Drawing Sheets

(51) Int. Cl.
 *B82Y 35/00* (2011.01)
 *H04N 7/18* (2006.01)

(56) References Cited

U.S. PATENT DOCUMENTS

| | | | |
|---|---|---|---|
| 6,934,929 | B2 | 8/2005 | Brist et al. |
| 7,061,623 | B2 | 6/2006 | Davidson |
| 7,336,341 | B2 | 2/2008 | Mimotogi et al. |
| 7,812,943 | B2 | 10/2010 | Silver et al. |
| 7,855,037 | B2 | 12/2010 | Kim |
| 7,864,294 | B2 | 1/2011 | Wang et al. |
| 7,872,741 | B2 | 1/2011 | Chou et al. |
| 2002/0136992 | A1 | 9/2002 | Ho et al. |
| 2003/0143132 | A1* | 7/2003 | Cerrina et al. ............. 422/186 |
| 2004/0233821 | A1* | 11/2004 | Saitoh et al. ............ 369/112.05 |
| 2005/0140988 | A1 | 6/2005 | Lee et al. |
| 2005/0183056 | A1* | 8/2005 | Mimotogi et al. ............ 716/19 |
| 2006/0114469 | A1* | 6/2006 | Horvath et al. ............ 356/450 |
| 2007/0188771 | A1* | 8/2007 | Liu et al. ............ 356/636 |
| 2007/0252986 | A1* | 11/2007 | Sandstrom ............ 356/319 |
| 2009/0161117 | A1 | 6/2009 | Huang et al. |
| 2009/0295963 | A1* | 12/2009 | Bamford et al. ............ 348/302 |
| 2010/0007881 | A1 | 1/2010 | Shyu et al. |
| 2010/0277581 | A1* | 11/2010 | Matsumoto et al. ............ 348/79 |
| 2011/0098992 | A1* | 4/2011 | Van Beurden et al. ............ 703/2 |
| 2012/0069170 | A1* | 3/2012 | Gesley ............ 348/79 |
| 2012/0092461 | A1* | 4/2012 | Fisker et al. ............ 348/46 |
| 2014/0160267 | A1* | 6/2014 | Kawakami et al. ............ 348/79 |

OTHER PUBLICATIONS

Attota, et al., "TSOM Method for Semiconductor Metrology", Metrology, Inspection, and Process Control for Microlithography XXV, edited by Christopher J. Raymond, Proc. of SPIE vol. 7971, 79710T, total 15 pages, Downloaded From: http://proceedings.spiedigitallibrary.org/ on Oct. 14, 2012.

Hoobler, et al., "Optical critical dimension (OCD) measurements for profile monitoring and control: Applications for mask inspection and fabrication", Proceedings of SPIE vol. 5256 23rd Annual BACUS Symposium on Photomask Technology, edited by Kurt R. Kimmel, Wolfgang Staud (SPIE, Bellingham, WA, 2003), pp. 638-645, Downloaded From: http://spiedigitallibrary.org/ on Oct. 14, 2012.

Attota, et al., "Optical Through-Focus Technique that Differentiates Small Changes in Line Width, Line Height and Sidewall Angle for CD, Overlay, and Defect Metrology Applications", Metrology, Inspection, and Process Control for Microlithography XXII, edited by John A. Allgair, Christopher J. Raymond, Proc. of SPIE, total 12 pages, vol. 6922, 69220E, (2008).

Moharam, et al., "Stable implementation of the rigorous coupled-wave analysis for surface-relief gratings: enhanced transmittance matrix approach", J. Opt. Soc. Am. A, pp. 1077-1086, vol. 12, No. 5/May 1995.

Umashankar, et al., "A Novel Method to Analyze Electromagnetic Scattering of Complex Objects", IEEE Transaction on Electromagnetic Compatibility, pp. 397-405, vol. EMC-24, No. 4, Nov. 1982.

Tompkins, et al., "Handbook of Ellipsometry", ISBN: 0-8155-1499-9, William Andrew, Inc., 13 Eaton Avenue, Norwich, NY 13815, total 902 pages, 2005.

Attota, et al., "Optical Illumination and Critical Dimension Analysis Using the Through-focus Focus Metric Method", Proceedings of SPIE vol. 6289, 62890Q, Sep. 5, 2006, 10 pages.

Attota, et al.; "Through-focus Scanning Optical Microscopy", Scanning Microscopies 2011: Advanced Microscopy Technologies for Defense, Homeland Security, Forensic, Life, Environmental, and Industrial Sciences, May 13, 2011, vol. 8036, No. 1, 9 pages total.

Communication dated Dec. 11, 2014, issued by the European Patent Office in counterpart European Application No. 12189262.4.

Attota, et al., "Optical Illumination and Critical Dimension Analysis Using the Through-focus Focus Metric Method", Proceedings of SPIE vol. 6289, 62890Q, 2006, 10 pages.

"Microscopy", Encyclopedia of Physics, total of 19 pages with English translation, Internet article: http://www.femto.com.ua/articles/part_1/2284.html, accessed and printed Jan. 15, 2013.

\* cited by examiner

OPTICAL MEASUREMENT SYSTEM AND METHOD FOR MEASURING CRITICAL DIMENSION OF NANOSTRUCTURE

CROSS-REFERENCE TO RELATED APPLICATIONS

This application claims priority from Russian Patent Application No. 2011142372, filed on Oct. 20, 2011, in the Russian Patent Office, and from Korean Patent Application No. 10-2012-0085388, filed on Aug. 3, 2012, in the Korean Intellectual Property Office, the disclosures of which are incorporated herein in their entirety by reference.

BACKGROUND

1. Field

Methods and apparatuses consistent with exemplary embodiments relate to measurement technology, and more particularly, to measuring a geometric variable with respect to a nanostructure by means of scattered light investigation while scanning an object having a nanostructure.

2. Description of the Related Art

In micro-lithography technology developed for manufacturing semiconductor chips, there is a recent trend to reduce a critical dimension (CD) of a manufactured structure. CD signifies a size of a nanostructure to be examined and has a value of about tens of nanometers. Currently, a CD that may be embodied is about 30 nm and will be 20 nm soon.

For mass production of a semiconductor structure having a very small CD, a demand for accuracy and reliability of measurement equipment, speed, and economical efficiency of a measurement process have been increased. Also, a conventional measurement method using a scanning electron microscope (SEM) and an atomic force microscope (AFM) is very slow and expensive particularly when examining a chip having a well-known topology in which critical dimensions of structures are slightly different from required values. For the measurement of the type above, optical methods based on technologies such as ellipsometry [see reference 1] and scatterometry [see reference 2] have been developed. In particular, a well-known optical critical dimension (OCD) method [see reference 3] is used to identify a semiconductor structure having a CD smaller than a Rayleigh limit.

These optical analysis methods have their merits and demerits. In the OCD method, dependence of sub-wavelength structure reflectivity from critical dimension value, wavelength of incident irradiation, and angle of incidence are used. There are two types of methods: one is to fix a wavelength of incident light and measure a degree of dependence on reflectivity with respect to an incident angle of light irradiated onto an object by a through-angle scanning method and the other is to fix an incident angle and measure a degree of dependence on reflectivity with respect to a wavelength by a through-wavelength scanning method. In the second method, spectrums of irradiation of incident and reflected light are measured and a degree of dependence on reflectivity with respect to a wavelength is calculated based on the spectrum of the incident and reflected light. The measured dependence is compared with a dependence calculated with respect to various CD values and the best coincidence of measured curve and calculated curve gives a required CD value.

Although the OCD technology is widely used in a semiconductor manufacturing process, it is impossible to perform an analysis of a non-periodic structure, a low periodic structure, and a structure formed of one or more isolated objects by the technology.

The non-periodic and isolated objects may be analyzed by a through-focus scanning optical microscopy (TSOM) [see reference 4] based on analysis of a non-contrast defocused image of an object recorded using an optical microscope while scanning the object in an optical axis direction.

In the TSOM technology, a mechanical scanning system for moving an object through-focus at an accuracy of tens of nanometers is a basic one and simultaneously is the weakest in view of reliability of a module for measuring a TSOM-plant. As the size of an object decreases and scanning steps decreases, a demand for reduction of scanning steps and the accuracy of positioning of an object increases. In this situation, when vibrations exist, the accuracy and reliability in measurement are generally lowered.

SUMMARY

One or more exemplary embodiments may provide an optical measurement system and method for measuring a CD of a nanostructure based on defocus image processing without using mechanical through focus scanning with respect to an object to be examined.

Additional exemplary aspects will be set forth in part in the description which follows and, in part, will be apparent from the description, or may be learned by practice of the presented exemplary embodiments.

According to an aspect of an exemplary embodiment, an optical measurement system for measuring a CD having a nanostructured surface including a nanostructure formed on a plane includes an image recording module including a microscope optical system which records a defocused image having an nonuniform degree of defocusing with respect to the nanostructured surface, an optical scheme parameter control module which sets and outputs to the microscope optical system optical scheme parameters for the microscope optical system, an image calculation module which receives the optical scheme parameters set by the optical scheme parameter control module and calculates an image of the nanostructured surface, and a comparison module which compares the defocused image recorded by the image recording module and the image calculated by the image calculation module.

A normal of the nanostructured surface of the sample may be inclined by a predetermined angle θ with respect to an optical axis of an objective lens included in the microscope optical system.

The predetermined angle θ may satisfy a condition that $\alpha < \theta < 2\alpha$, wherein $\alpha \approx d2/\lambda D$, λ is a center wavelength of an illumination spectrum of the microscope optical system, d is a spatial resolution of the objective lens included in the microscope optical system, and D is a maximum character size of the nanostructure.

The optical scheme parameter control module may be configured to measure and/or modify the optical scheme parameters.

The microscope optical system may include a light source, a polarizer, an amplitude mask, a beam splitter, an objective lens, and an image sensor.

The optical scheme parameters may include at least one of a frequency of an illumination spectrum irradiated by the light source, a polarization axis direction of the polarizer, a size and/or a shape and/or a location of an opening of the amplitude mask, a numerical number of the objective lens, and an angle of inclination of the nanostructured surface to an optical axis of the objective lens.

A bandwidth of the illumination spectrum may be 100 nm or less and a wavelength range may be 350 nm~700 nm.

The amplitude mask may be disposed on a surface that is optically conjugated with a back focal plane of the objective lens.

The size of an opening formed in the amplitude mask may satisfy a condition that 0.1<(NAill/NA)<0.8, wherein NAill is a numerical number of illumination and NA is a numerical number of the objective lens.

A numerical number of the objective lens may have a value between 0.4 and 0.9.

The optical scheme parameter control module may include a spectrometer, an amplitude mask positioning system setting a position of the amplitude mask, a charge-coupled device (CCD) camera which measures a size and a shape of the opening of the amplitude mask, and a nanostructured surface positioning system which determines an angle of inclination of a normal of the nanostructured surface with respect to a normal of the objective lens.

The microscope optical system may use a Kohler illumination method.

The image calculation module may calculate an image by using a rigorous coupled wave analysis (RCWA) method and a finite-difference time-domain (FDTD) method.

According to an aspect of another exemplary embodiment, a method of measuring a critical dimension (CD) having a nanostructured surface including a nanostructure formed on a plane includes selecting an optical scheme parameter of a microscope optical system which records an image of the nanostructured surface, recording a defocused image having an nonuniform degree of defocusing with respect to the nanostructured surface by using the microscope optical system, calculating an image of the nanostructured surface within a predetermined CD range according to a selected optical scheme parameter, and determining an estimated value of a CD by comparing the calculated image with the recorded defocused image.

The T normal of the nanostructured surface of the sample may be inclined by a predetermined angle θ with respect to an optical axis of an objective lens included in the microscope optical system.

The predetermined angle θ may satisfy a condition α<θ<2 α, wherein α≈$d^2$/λD, wherein λ is a center wavelength of an illumination spectrum of the microscope optical system, d is a spatial resolution of the objective lens included in the microscope optical system, and D is a maximum character size of the nanostructure.

The optical scheme parameter may include at least one of a frequency of an illumination spectrum irradiated by a light source, a polarization axis direction of a polarizer, a size and/or a shape and/or a location of an opening of an amplitude mask, a numerical number of the objective lens, and an angle of inclination of the nanostructured surface with respect to an optical axis of the objective lens.

A bandwidth of the illumination spectrum may be 100 nm or less and a wavelength range may be 350 nm~700 nm.

The size of the opening formed in the amplitude mask may satisfy a condition that 0.1<(NAill/NA)<0.8, wherein NAill is a numerical number of illumination and NA is a numerical number of the objective lens.

A numerical number of the objective lens may have a value between 0.4 and 0.9.

A bright field technology may be used to record the defocused image.

The calculating of the image of the nanostructured surface may include using a rigorous coupled wave analysis (RCWA) method and a finite-difference time-domain (FDTD) method.

The determining of the estimated value of the CD includes using an optimization technique for calculating a CD value when an absolute value between a measured image and a calculated image is minimum.

The determining of the estimated value of the CD may include comparing calculated images from a library of calculated images with the recorded defocused image step-by-step.

The determining of the estimated value of the CD may include extracting, for each of the calculated image and the measured image, a focus metric curve depending on a degree of defocusing and a topology of the nanostructure and comparing the extracted focus metric curves with each other.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
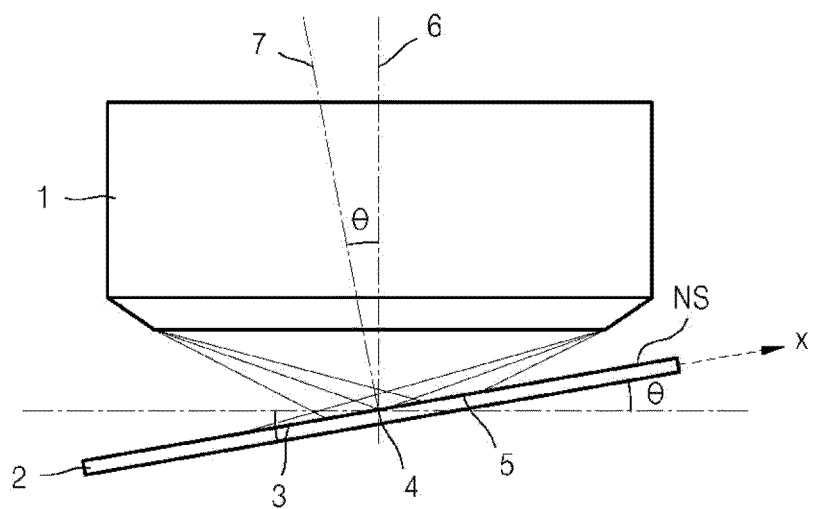
FIG. 1 is a view schematically illustrating an arrangement structure between a sample to be examined and an objective lens to detect a defocused image of a nanostructured surface in an optical measurement system and method according to an exemplary embodiment.

Reference will now be made in detail to exemplary embodiments which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

FIG. 1 is a view schematically illustrating an arrangement structure in which a sample 2 to be examined is arranged at an incline with respect to an objective lens 1 to detect a defocused image of a nanostructured surface NS in an optical measurement system and method according to an exemplary embodiment.

A nanostructure is a structure in which at least one character has a size less than a Rayleigh resolution limit, that is, about tens of nanometers. In the optical measurement system and method according to the present embodiment, only one defocused image is registered with respect to the sample 2 to be examined having a nanostructured surface NS and then a CD of the nanostructured surface NS is measured by using the registered defocused image.

Referring to FIG. 1, the sample 2 is disposed under the objective lens 1 and has the nanostructured surface NS formed on a plane surface thereof. The sample 2 is disposed under the objective lens 1 such that an optical axis 6 of the objective lens 1 is inclined by an angle θ with respect to a normal 7 of the nanostructured surface NS. According to this arrangement, an area 4 where an image is clearly formed on an image sensor of a microscope optical system, that is, an optimal focus position, exists on the nanostructured surface NS to be examined. Also, areas 3 and 5, where an image is not clearly formed, that is, a non-focus area of the objective lens 1, exists on the nanostructured surface NS. A degree of defocusing appears to be nonuniform in a direction in which the sample 2 is inclined, that is, in a direction x. For example, the degree of defocusing changes linearly depending on the viewing angle. Thus, mechanical through-focus scanning, in which the sample 2 is moved in a direction penetrating the focus of the objective lens 1, which is generally used to obtain an image having a different defocus degree, is not required.

Figure 2:
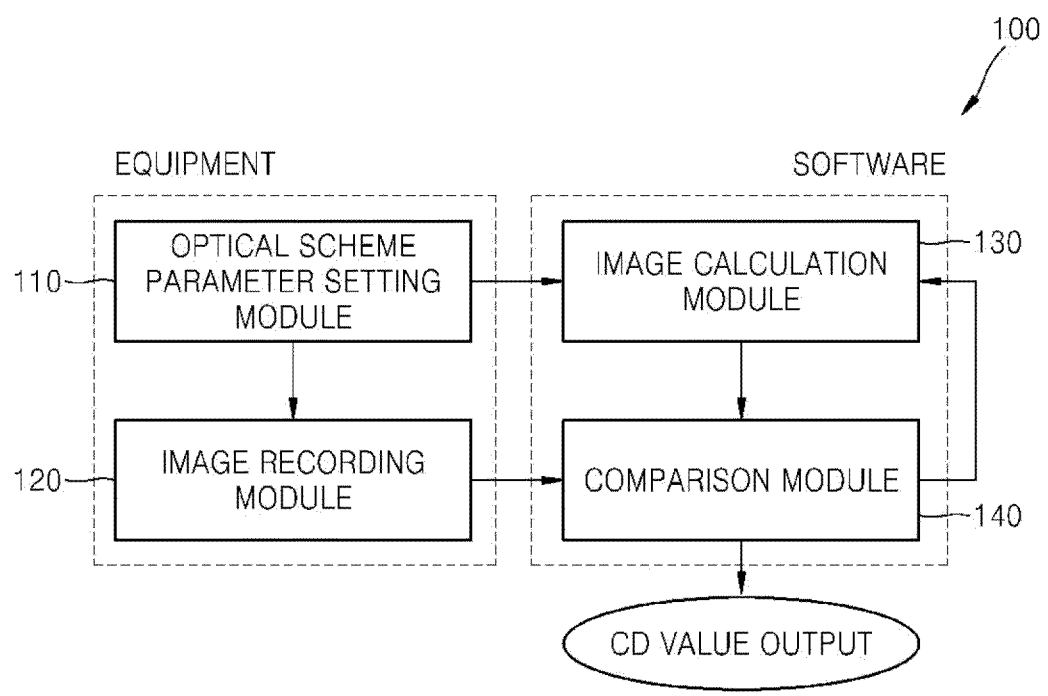
FIG. 2 is a block diagram schematically illustrating a structure of an optical measurement system according to an exemplary embodiment.
Figure 3:
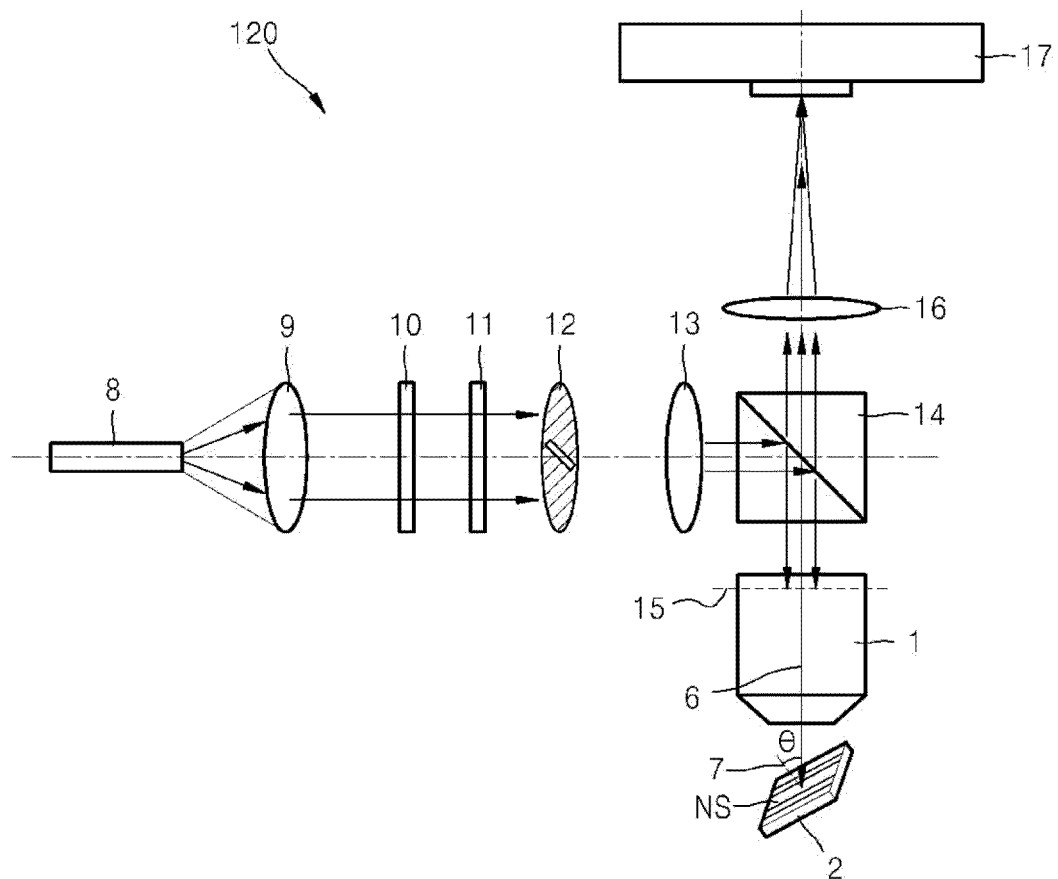
FIG. 3 is a view schematically illustrating an optical arrangement of an image recording module that can be employed in the optical measurement system according to an exemplary embodiment.

FIG. 2 is a block diagram schematically illustrating a structure of an optical measurement system 100 according to an exemplary embodiment. FIG. 3 is a view schematically illustrating an optical arrangement of an image recording module 120 that can be employed in the optical measurement system 100, according to an exemplary embodiment.

The optical measurement system 100 may be a combination of equipment and software. The optical measurement system 100 includes an optical scheme parameter setting module 110, an image recording module 120, an image calculation module 130, and a comparison module 140.

The image recording module 120 is an optical module recording an image of the nanostructured surface NS, based on a microscope optical system. The recorded image is an image including complex superposition of diffractive patterns. An analysis to extract an unknown CD may be performed from the recorded image.

Referring to FIG. 3, the image recording module 120 forms the microscope optical system to obtain a defocused image of the nanostructured surface NS of the sample 2 to be examined. The image recording module 120 may employ, for example, a microscope optical system configuration using a Kohler illumination method performed in a bright field mode. The image recording module 120 may include a light source 8, a condenser lens 9, a polarizer 11, an amplitude mask 12, a beam splitter 14, the objective lens 1, and an image sensor 17.

The light source 8 provides illumination to obtain an image of the sample 2. The sample 2 may be provided with an illumination spectrum of light in a predetermined wavelength range. The illumination spectrum may be determined by the light source 8 or the light source 8 and a color filter 10.

The beam splitter 14 branches an optical path to allow light irradiated from the light source 8 to proceed toward the sample 2 and also allow light reflected or scattered by the sample 2 to proceed toward the image sensor 17. The beam splitter 14 may be a polarized beam splitter.

The amplitude mask 12 includes an opening having a predetermined shape and size and adjusts the size of a cross section of a beam. The amplitude mask 12 may be arranged on a plane that is optically conjugated with a back focal plane 15 of the objective lens 1.

A tube lens 16 may be provided between the beam splitter 14 and the image sensor 17. A relay lens 13 may be provided between the amplitude mask 12 and the beam splitter 14. The image sensor 17 is a device that converts an optical image to an electric signal and a charge-coupled device (CCD), for example, may be used therefor.

Referring back to FIG. 2, the optical scheme parameter setting module 110 sets parameters forming the optical system to record an image of the nanostructured surface NS. For example, the optical scheme parameter setting module 110 may set and output optical scheme parameters for the optical system of FIG. 3. Also, the optical scheme parameters may be measured and/or changed.

The image recording module 120 records an image of the nanostructured surface NS according to the optical scheme parameters set by the optical scheme parameter setting module. Also, the optical scheme parameters are transferred to the image calculation module 130 so that the image calculation module 130 may calculate an image of the nanostructured surface NS.

The optical scheme parameters include parameters related to the arrangement of optical elements or illumination conditions. For example, the optical scheme parameters may include at least one of a frequency of an illumination spectrum irradiated by the light source 8, a direction of a polarization axis of the polarizer 11, a size and/or shape and/or position of the opening of the amplitude mask 12, a numerical aperture of the objective lens 1, and an angle of inclination of the NS to the optical axis 6 of the objective lens 1.

Optimal optical scheme parameters for measurement of the nanostructured surface NS may depend on a topology and a CD value of the nanostructured surface NS and may be determined within a range, as discussed below.

The illumination spectrum may be a spectrum having a bandwidth of about 100 nm or less in a wavelength range of 350~700 nm.

The amplitude mask 12 may be disposed on a surface that is optically conjugated with the back focal plane 15 of the objective lens 1. The size of the opening of the amplitude mask 12 may be set to satisfy a condition that $0.1 < (NAill/NA) < 0.8$, where NAill is a numerical aperture of illumination and NA is a numerical aperture of the objective lens 1. The NA of the objective lens 1 may satisfy a condition that $0.4 < NA < 0.9$.

The angle θ of inclination of the normal 7 of the nanostructured surface NS to the optical axis 6 of the objective lens 1 may satisfy a condition that $\alpha < \theta < 2\alpha$. In the condition, $\alpha \approx d^2 / \lambda D$, where λ is a center wavelength of the illumination spectrum, d is a spatial resolution of the objective lens 1, and D is the maximum character size of the nanostructure.

To this end, the optical scheme parameter setting module 110 may include a spectrometer, an amplitude mask positioning system setting a position of the amplitude mask 12, a CCD camera measuring a size and shape of the opening of the amplitude mask 12, and a nanostructured surface positioning system setting an angle of inclination of the normal 7 of the nanostructured surface NS to the optical axis 6 of the objective lens 1.

The image recording module 120, assuming that an unknown CD varies within a known range that $CD1 < CD < CD2$, calculates an image with inputs of a predetermined CD value in the range and the parameters set by the image calculation module 130. The image calculation module 130 may calculate an image by using a rigorous coupled wave analysis (RCWA) method [see reference 5] and a finite-difference time-domain (FDTD) method [see reference 6].

The comparison module 140 compares a calculated image and a measured image. The comparison module 140 for comparing the measured image and the calculated image of the nanostructured surface NS is an important module in a measurement system. For comparison, the measure image of the image recording module 120 and the calculated image of the image calculation module 130 calculated in consideration of a set CD value change range are transferred to the comparison module 140 as inputs. As a result of comparison, the best estimation of a measured CD value and/or a narrower adjusted range of CD value variation are produced.

The calculation by the image calculation module 130 and the comparison by the comparison module 140 continue by changing a CD value until the calculated image and the measured image match. A CD value when the calculated image and the measured image match is the best estimated value of the measured CD value of the nanostructured surface NS.

Figure 4:
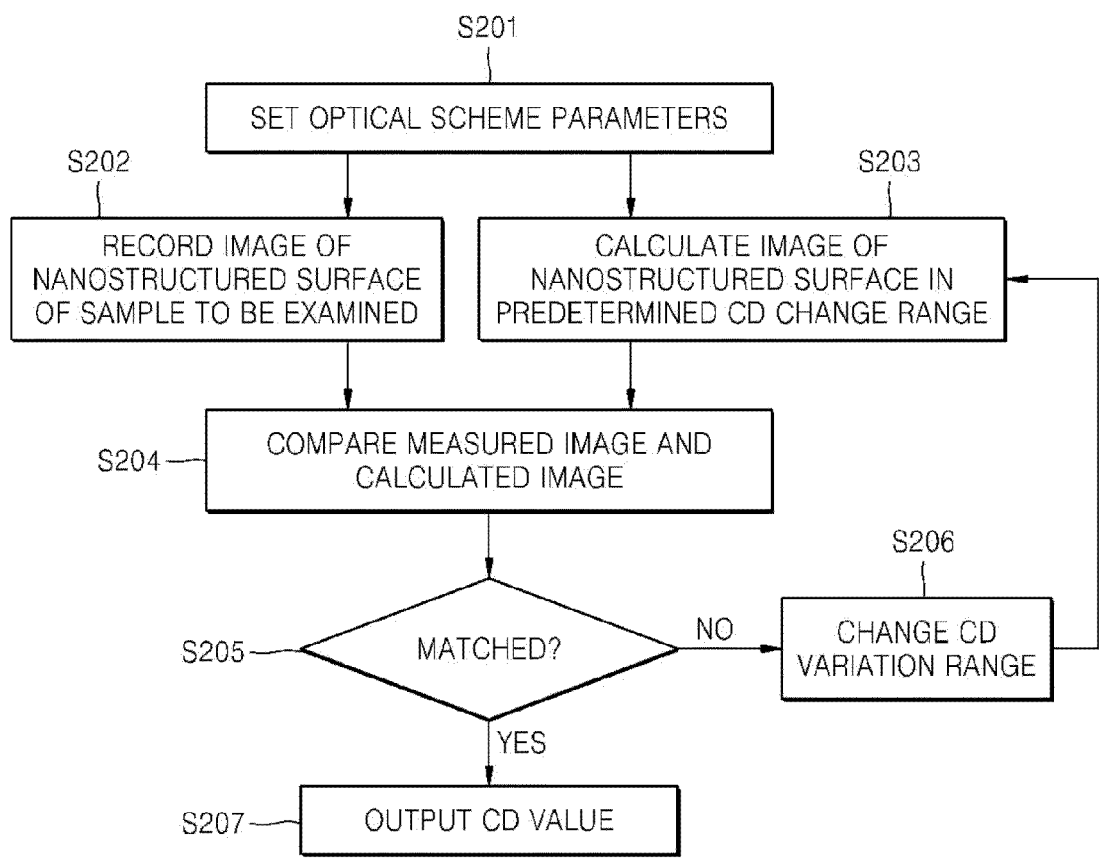
FIG. 4 is a flowchart for explaining an optical measurement method according to an exemplary embodiment.

FIG. 4 is a flowchart for explaining an optical measurement method according to an exemplary embodiment.

First, optical scheme parameters for setting a microscope optical system to record an image of a nanostructured surface NS are set (S201). The optical scheme parameters may be the parameters described with reference to FIGS. 2 and 3.

A defocused image of the nanostructured surface NS is recorded by using a microscope optical system formed according to the optical scheme parameters (S202). To record a defocused image, as illustrated in FIG. 1, the sample 2 having the nanostructured surface NS is arranged at an incline with respect to the objective lens 1.

The image of the nanostructured surface NS is calculated in consideration of the set optical scheme parameters and the predetermined CD range (S203). A software module for calculation is realized owing to a combination of methods of electromagnetic field calculation RCWA [see reference 5] and FDTD [see reference 6], which are based on an accurate solution of the Maxwell's equation. Input parameters for calculation are optical scheme parameters set to define conditions for illumination and nanostructured surface recording, and a CD value variation range. In an actual semiconductor manufacturing process, an approximate CD value variation range is well known and may be determined according to the opinions of experts.

Next, the calculated image and the measured image are compared with each other (S204). As a result of comparison, the best estimation of the measured CD value and/or a CD value variation range that is more narrowly adjusted are produced. Some exemplary methods for comparing digital images to be applied to the software module for comparison are known. For example, a result of the comparison may be a number indicating a degree of matching between the measured image and the calculated image. A focus metric parameter [see reference 7] which is defined to analyze images, each having a different degree of defocus may be used and is described below with reference to FIGS. 5A, 5B, and 6.

A degree of matching between a calculated image and a measured image is determined within a given range of accuracy (S205). A CD value at which the two images are matched is output as a measured CD value. If the two images do not match, a CD variation range is changed (S206), an image of the nanostructured surface NS is calculated (S203), and a newly calculated image is compared with the measured image (S204). A more narrowly adjusted CD value variation range may be determined according to a result of the comparison between the measured image and the calculated image.

There are many methods of selecting a CD value by comparing the measured image and the calculated image. For example, an optimization technique and an image library calculation technology may be used. When the optimization technique is used, the optimal estimation of a CD value is obtained when an absolute value between the measured image and the calculated image is minimum. When the library calculation technology is used, the measured image is compared with previously calculated images step-by-step on an assumption that a CD value changes within a known range.

Figure 5A:
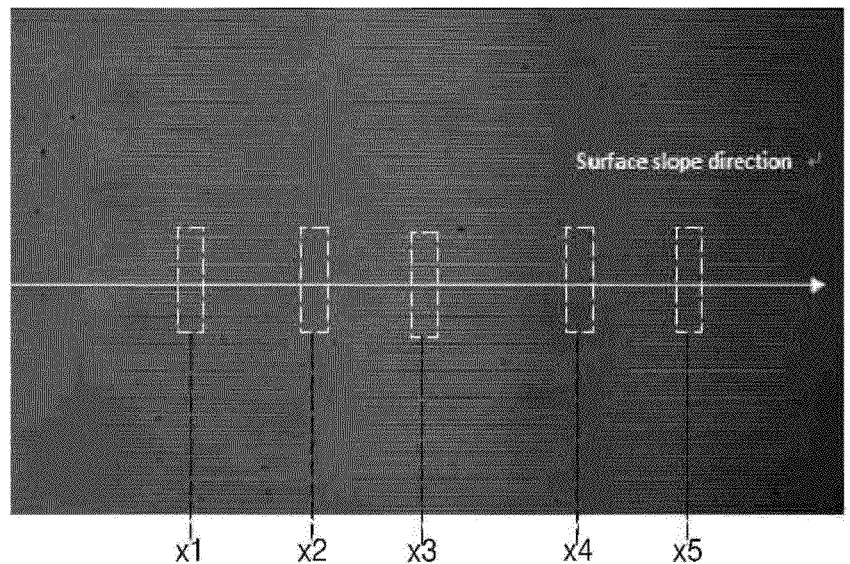
FIG. 5A is an example of a measurement image of a nanostructured surface of a sample, in which a periodic grating is formed on a glass surface with a period of about 3 μm and a grating line having a height of about 100 nm.
Figure 5B:
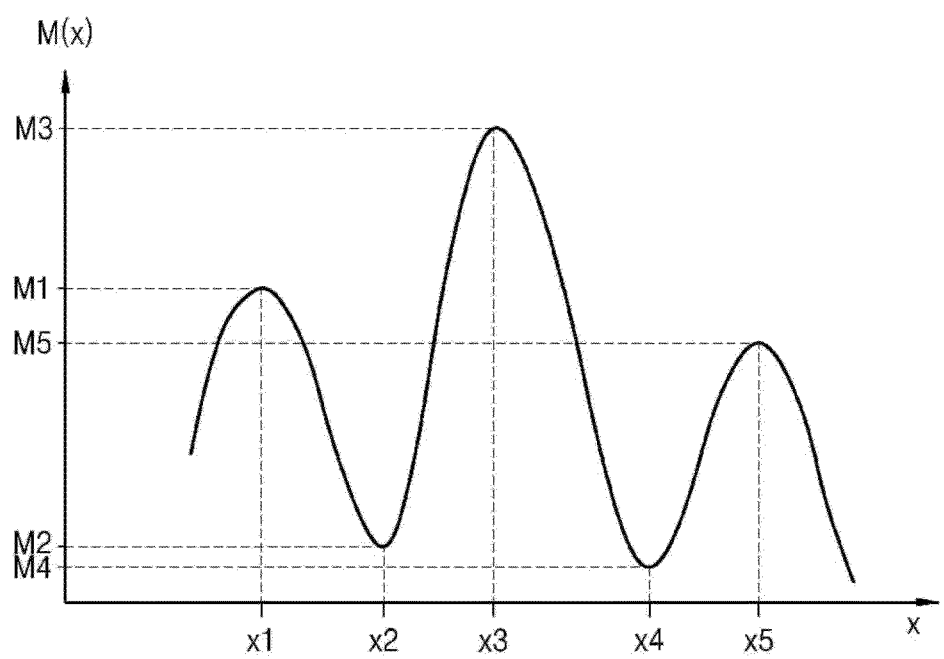
FIG. 5B shows a focus metric curve extracted from the image of FIG. 5A.

FIG. 5A is an example of a measurement image of a nanostructured surface of a sample, in which a periodic grating is formed on a glass surface with a period of about 3 μm and a grating line having a height of about 100 nm. FIG. 5B shows a focus metric curve extracted from the image of FIG. 5A.

A focus metric parameter denotes a characteristic of contrast of an image in a given degree of defocusing and may be a standard deviation calculated from a digital image indicating a data array like the equation below. Parameters $M(I_{i,j})$ depending on a topology of an object and the degree of defocusing are given corresponding to defocused images $I_{i,j}$. The parameter characterizes image contrast at the given degree of defocusing.

$$M(I_{i,j}) = StD(I_{i,j}) = \sqrt{\frac{1}{N} \cdot \sum_{i,j} (I_{i,j} - \bar{I})^2} \;;\; \bar{I} = \frac{1}{N} \cdot \sum_{i,j} I_{i,j} \quad (1)$$

In the equation, $M(I_{i,j})$ denotes a focus metric, $I_{i,j}$ denotes a pixel intensity in coordination $(i,j)$ in an image, $\bar{I}$ denotes an average intensity of all pixels of an image, and N denotes the total number of image pixels.

A through-focus focus-metric curve $M(h)$ may be obtained by calculating a focus metric of an image at each defocus position. In the $M(h)$, h is the position of an object in a focus direction.

In the current embodiment in which the nanostructured surface NS is arranged at an incline with respect to the objective lens 1, since the degree of defocusing varies according to the direction of inclination of the nanostructured surface NS, the focus metric curve may be calculated along the investigated inclined surface. To this end, a predetermined window is defined. The size of a window is small so that a degree of defocusing may be regarded as a constant in the window. Next, the window is scanned along the nanostructured surface NS and the focus metric is calculated at each window position. A focus metric $M(x)$ is obtained as a result of the image processing, where x denotes a coordinate indicating the position of the window, that is, a coordinate according to a direction in which the nanostructured surface NS is inclined.

In FIG. 5A, an arrow indicates a surface slope direction. Moire strips are easily identified by an arrow direction on the image and scanning windows are seen at some locations on the image.

FIG. 5B illustrates a focus metric curve extracted from the image of FIG. 5A, that is, an $M(x)$ graph. The shape of the curve and all essential features are dependent on the optical scheme parameters defining conditions for illumination and image recording, and a CD of the grating (having a height of 100 nm).

Figure 6:
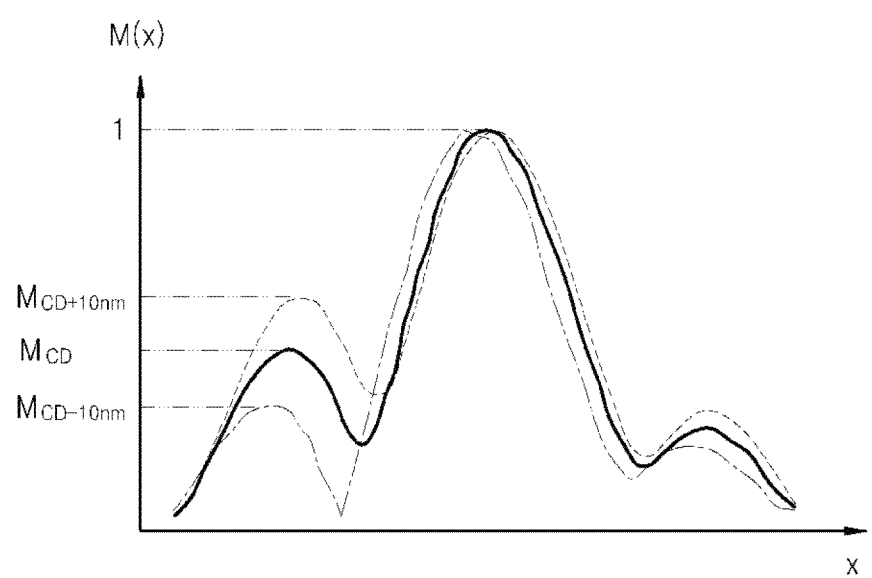
FIG. 6 shows three focus metric curves calculated at the range of grating lines height variation CD−10 nm≤CD≤CD+10 nm, as an example of a library construction of a calculated image for comparison with a measured image.

FIG. 6 shows three focus metric curves calculated within the range of grating lines height variation CD−10 nm≤CD≤CD+10 nm, as an example of a library construction of a calculated image for comparison with a measured image.

In FIG. 6, it is easily observed that the focus metric curves $M(x)$ are normalized to 1 and the shapes of curves calculated with respect to grating having a height difference of 10 nm are similar to one another. The curves have three maximum points that are clearly shown. The measured and calculated focus metric curves may be compared with a predetermined parameter related to the measured CD. In this case, the parameter for comparing the focus metric curves extracted from the measurement and the calculation corresponds to the left maximum value of the curves and is a focus metric value satisfying the following condition.

$$MCD-10nm<MCD<MCD+10nm \qquad 5$$

When a focus metric curve (MCD*) extracted from the measured image and a calculated focus metric curve (MCD) are determined, with a required accuracy, that MCD*=MCD, a CD value may be assumed to be the best estimation of a measured CD* value.

According to the above-mentioned optical measurement system and method, a single defocused image is measured with respect to a nanostructured surface of a sample to be examined and a CD value is estimated by comparing the estimated defocused image with a calculated image. The single defocused image is an image having a different degree of defocusing. Thus, a process of mechanically scanning a sample in a focus direction in order to obtain an image having a different degree of defocusing is not needed so that reliability, stability, and accuracy of the measurement are high.

According to the above-mentioned optical measurement system and method, a CD of a nanostructure having not only a periodic structure but also a non-periodic structure may be measured.

Although an optical measurement system and method that measure a CD of a nanostructure according to exemplary embodiments are described with reference to the accompanying drawings, it should be understood that the exemplary embodiments described herein should be considered in a descriptive sense only and not for purposes of limitation. Descriptions of features or aspects within each embodiment should typically be considered as available for other similar features or aspects in other embodiments.

The following is a list of reference documents quoted in the above description.

[1]—"Handbook of ellipsometry", Harland G. Tompkins, Eugene A. Irene;

[2]—PETRE CĂTĂLIN LOGOFĂTU et. al., Rom. Journ. Phys., Vol. 55, Nos. 3-4, P. 376-385, Bucharest, 2010;

[3]—Ray J. Hoobler and Ebru Apak, Proceedings of SPIE Vol. 5256 23rd Annual BACUS Symposium on Photomask Technology;

[4]—Attota, R., Silver, R. M., and Barnes, B. M., "Optical through-focus technique that differentiates small changes in line width, line height, and sidewall angle for CD, overlay, and defect metrology applications," Proc. SPIE 6922, 6922OE-1-13, (2008);

[5]—M. G. Moharam, Drew A. Pommet, and Eric B. Grann. J. Opt. Soc. Am. A, 12(5):1077{1086}, May 1995;

[6]—K. Umashankar, A. Taflove, "A Novel Method to Analyze Electromagnetic Scattering of Complex Objects", IEEE (1982);

[7]—Attota, R., Silver R. M., and Potzick, J., "Optical illumination and critical dimension analysis using the through-focus focus metric," Proc. SPIE, 6289, p. 62890Q-1-10 (2006).

[8]—Encyclopedia of physics and engineering. Microscopy. www.femto.com.ua/articles/part_1/2284.html.

What is claimed is:

1. An optical measurement system for measuring a critical dimension of a nanostructured surface, the optical measurement system comprising:
an image recording module comprising a microscope optical system which records a defocused image having a nonuniform degree of defocusing with respect to the nanostructured surface;
an optical scheme parameter control module which sets and outputs to the microscope optical system optical scheme parameters for the microscope optical system;
an image calculation module which receives the optical scheme parameters and calculates an image of the nanostructured surface; and
a comparison module which compares the defocused image recorded by the image recording module and the image calculated by the image calculation module;
wherein the microscope optical system comprises an objective lens, wherein a normal of the nanostructured surface of the sample is inclined by an angle θ with respect to an optical axis of the objective lens; and
wherein the predetermined angle θ satisfies a condition:

$$\alpha<\theta<2\alpha,$$

wherein $\alpha \approx d^2/\lambda D$, wherein λ is a center wavelength of an illumination spectrum of the microscope optical system, d is a spatial resolution of the objective lens, and D is a maximum character size of the nano structure.

2. The optical measurement system of claim 1, wherein the optical scheme parameter control module is configured to perform at least one of measuring and modifying the optical scheme parameters.

3. The optical measurement system of claim 1, wherein the microscope optical system uses a Kohler illumination method.

4. The optical measurement system of claim 1, wherein the image calculation module calculates an image by using a rigorous coupled waves analysis method and a finite-difference time-domain method.

5. The optical measurement system of claim 1, wherein the microscope optical system further comprises a light source, a polarizer, an amplitude mask, a beam splitter, and an image sensor.

6. The optical measurement system of claim 5, wherein the optical scheme parameters comprise at least one of: a frequency of an illumination spectrum irradiated by the light source, a polarization axis direction of the polarizer, a size of an opening of the amplitude mask, a shape of an opening of the amplitude mask, a location of an opening of the amplitude mask, a numerical number of the objective lens, and an angle of inclination of the nanostructured surface with respect to an optical axis of the objective lens.

7. The optical measurement system of claim 5, wherein a bandwidth of the illumination spectrum is 100 nm or less and a wavelength range is 350 nm-700 nm.

8. The optical measurement system of claim 5, wherein the amplitude mask is disposed on a surface that is optically conjugated with a back focal plane of the objective lens.

9. The optical measurement system of claim 8, wherein the size of an opening formed in the amplitude mask satisfies a condition:

$$0.1<(NAill/NA)<0.8,$$

wherein NAill is a numerical number of illumination and NA is a numerical number of the objective lens.

10. The optical measurement system of claim 5, wherein a numerical number of the objective lens is between 0.4 and 0.9.

11. The optical measurement system of claim 5, wherein the optical scheme parameter control module comprises:
a spectrometer;
an amplitude mask positioning system which determines a position of the amplitude mask;
a charge-coupled device camera which measures a size and a shape of the opening of the amplitude mask; and a nanostructured surface positioning system which determines an angle of inclination of a normal of the nanostructured surface with respect to a normal of the objective lens.

12. A method of measuring a critical dimension (CD) having a nanostructured surface including a nanostructure formed on a plane, the method comprising:

selecting an optical scheme parameter of a microscope optical system which records an image of the nanostructured surface;

recording a defocused image having a nonuniform degree of defocusing with respect to the nanostructured surface by using the microscope optical system;

calculating an image of the nanostructured surface within a predetermined CD range according to the selected optical scheme parameter; and determining an estimated value of a CD by comparing the calculated image with the recorded defocused image;

wherein the a normal of the nanostructured surface of the sample is inclined by a predetermined angle θ with respect to an optical axis of an objective lens included in the microscope optical system; and wherein the predetermined angle θ satisfies a condition:

$$\alpha < \theta < 2\alpha,$$

wherein $\alpha \approx d^2/\lambda D$, wherein $\lambda$, is a center wavelength of an illumination spectrum of the microscope optical system, d is a spatial resolution of the objective lens, and D is a maximum character size of the nano structure.

13. The method of claim 12, wherein the recording the defocused image comprises using a bright field technology.

14. The method of claim 12, wherein, the calculating of the image of the nanostructured surface comprises using a rigorous coupled waves analysis method and a finite-difference time-domain method.

15. The method of claim 12, wherein, the determining of the estimated value of the CD comprises using an optimization technique for calculating a CD value when an absolute value between a measured image and a calculated image is minimum.

16. The method of claim 12, wherein, the determining of the estimated value of the CD comprises comparing images from a library of calculated images with the recorded defocused image step-by-step.

17. The method of claim 12, wherein, the determining of the estimated value of the CD comprises extracting, for each of the calculated image and the measured image, a focus metric curve depending on a degree of defocusing and a topology of the nanostructure and comparing the extracted focus metric curves with each other.

18. The method of claim 12, wherein the optical scheme parameter comprises at least one of: a frequency of an illumination spectrum irradiated by a light source, a polarization axis direction of a polarizer, a size of an opening of an amplitude mask, a shape of the opening of the amplitude mask, the location of the opening of the amplitude mask, a numerical number of the objective lens, and an angle of inclination of the nanostructured surface with respect to an optical axis of the objective lens.

19. The method of claim 18, wherein a bandwidth of the illumination spectrum is 100 nm or less and a wavelength range is 350 nm-700 nm.

20. The method of claim 18, wherein the size of the opening of the amplitude mask satisfies a condition:

$$0.1 < (NAill/NA) < 0.8,$$

wherein NAill is a numerical number of illumination and NA is a numerical number of the objective lens.

21. The method of claim 18, wherein a numerical number of the objective lens is between 0.4 and 0.9.

* * * * *